(12) United States Patent
Venugopal et al.

(10) Patent No.: US 9,397,023 B2
(45) Date of Patent: Jul. 19, 2016

(54) INTEGRATION OF HEAT SPREADER FOR BEOL THERMAL MANAGEMENT

(71) Applicant: Texas Instruments Incorporated, Dallas, TX (US)

(72) Inventors: Archana Venugopal, Dallas, TX (US); Marie Denison, Plano, TX (US); Luigi Colombo, Dallas, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/499,216

(22) Filed: Sep. 28, 2014

(65) Prior Publication Data
US 2016/0093551 A1 Mar. 31, 2016

(51) Int. Cl.
H01L 23/34 (2006.01)
H01L 23/373 (2006.01)
H01L 23/532 (2006.01)
H01L 23/522 (2006.01)
H01L 23/528 (2006.01)
H01L 21/768 (2006.01)
H01L 21/48 (2006.01)
H01L 21/02 (2006.01)

(52) U.S. Cl.
CPC .......... *H01L 23/373* (2013.01); *H01L 21/0262* (2013.01); *H01L 21/02527* (2013.01); *H01L 21/02606* (2013.01); *H01L 21/4871* (2013.01); *H01L 21/76877* (2013.01); *H01L 23/528* (2013.01); *H01L 23/5226* (2013.01); *H01L 23/53276* (2013.01)

(58) Field of Classification Search
None
See application file for complete search history.

(56) References Cited

U.S. PATENT DOCUMENTS

| 6,800,886 | B2 * | 10/2004 | Awano | B82Y 10/00 257/276 |
| 2007/0096326 | A1 * | 5/2007 | Chang | H01L 21/76849 257/764 |
| 2009/0281227 | A1 * | 11/2009 | Stern | C08L 71/00 524/496 |
| 2012/0042922 | A1 * | 2/2012 | Kondo | C01B 31/04 136/200 |
| 2012/0280253 | A1 * | 11/2012 | Sung | H01L 23/3732 257/77 |

* cited by examiner

*Primary Examiner* — Benjamin Sandvik
*Assistant Examiner* — Herve Assouman
(74) *Attorney, Agent, or Firm* — Daniel Chan; Frank D. Cimino

(57) ABSTRACT

A microelectronic device includes a heat spreader layer on an electrode of a component and a metal interconnect on the heat spreader layer. The heat spreader layer is disposed above a top surface of a substrate of the semiconductor device. The heat spreader layer is 100 nanometers to 3 microns thick, has an in-plane thermal conductivity of at least 150 watts/meter-° K, and an electrical resistivity less than 100 micro-ohm-centimeters.

8 Claims, 6 Drawing Sheets

INTEGRATION OF HEAT SPREADER FOR BEOL THERMAL MANAGEMENT

FIELD OF THE INVENTION

This invention relates to the field of microelectronic devices. More particularly, this invention relates to thermal management structures in microelectronic devices.

BACKGROUND OF THE INVENTION

Semiconductor devices with localized heat generating components experience hot spots which cause reduced reliability. Removing the heat while maintaining desired costs and structural form factors has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device includes a heat spreader layer on an electrode of a component and a metal interconnect on the heat spreader layer. The heat spreader layer is disposed above a top surface of a substrate of the semiconductor device. The heat spreader layer is 100 nanometers to 3 microns thick, has an in-plane thermal conductivity of at least 150 watts/meter-° K, and an electrical resistivity less than 100 micro-ohm-centimeters.

DETAILED DESCRIPTION OF EXAMPLE EMBODIMENTS

The following co-pending patent application is related and hereby incorporated by reference: U.S. patent application Ser. No. 14/499,222, (filed simultaneously with this application).

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
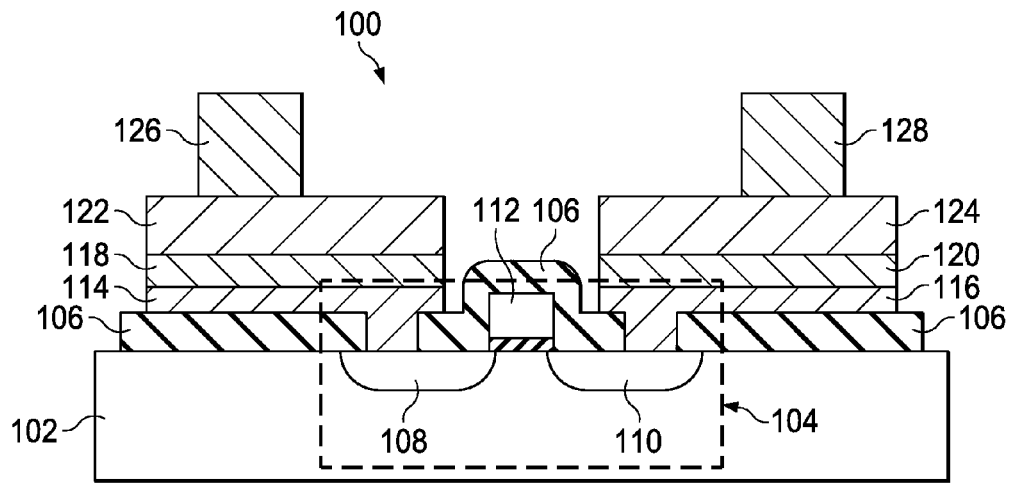
FIG. 1 is a cross section of an example microelectronic device including a heat spreader layer.

FIG. 1 is a cross section of an example microelectronic device including a heat spreader layer. The microelectronic device 100 is formed on a substrate 102 such as a semiconductor substrate 102. The microelectronic device 100 contains a component 104, depicted as a metal oxide semiconductor (MOS) transistor 104 in the instant example, formed in and on the substrate 102. The component 104 may be, in other examples, a resistor, a diode, a bipolar junction transistor, another type of transistor, or other component which generates heat during operation of the microelectronic device 100. The microelectronic device 100 may include a dielectric layer 106 above the substrate 102 to electrically isolate nodes such as a source 108, a drain 110 and a gate 112 of the MOS transistor 104. The microelectronic device 100 includes a source electrode 114 contacting the source 108, and a drain electrode 116 contacting the drain 110. The source electrode 114 and the drain electrode 116 may include, for example, a liner of titanium or titanium tungsten, and a layer of aluminum with a few percent titanium, copper and/or silicon over the liner, and may be formed concurrently. The microelectronic device 100 includes a first heat spreader layer 118 formed on the source electrode 114 and a second heat spreader layer 120 formed on the drain electrode 116. The first heat spreader layer 118 and the second heat spreader layer 120 may be formed concurrently, and are separate to provide electrical isolation between the source electrode 114 and the drain electrode 116. A first metal interconnect 122 is formed on the first heat spreader layer 118 and a second metal interconnect 124 is formed on the second heat spreader layer 120. The first metal interconnect 122 and the second metal interconnect 124 may be formed concurrently, and may include, for example, an adhesion layer of titanium or titanium tungsten, a layer of aluminum with a few percent titanium, copper and/or silicon over the adhesion layer, and a cap layer of titanium, titanium tungsten or titanium nitride over the layer of aluminum. The microelectronic device 100 includes a first bond structure 126 which is electrically coupled to the first metal interconnect 122 and includes a second bond structure 128 which is electrically coupled to the second metal interconnect 124. In the instant example, the first bond structure 126 and the second bond structure 128 are bump bond pillars 126 and 128. In other examples, the first bond structure 126 and the second bond structure 128 may be wire bonds, beam leads, through-substrate vias, or clips.

The first heat spreader layer 118 and the second heat spreader layer 120 have a same composition and structure. The first heat spreader layer 118 and the second heat spreader layer 120 are 100 nanometers to 3 microns thick. The heat spreader layers 118 and 120 have in-plane thermal conductivities of at least 150 watts/meter-° K, and electrical resistivities less than 100 micro-ohm-centimeters. The term in-plane thermal conductivity refers to lateral thermal conductivity in the heat spreader layer, that is, parallel to a top surface of the substrate. The heat spreader layers 118 and 120 may include, for example, graphite, a layer of carbon nanotubes (CNT), and/or multiple layers of graphene. In the instant example, the first heat spreader layer 118 and the second heat spreader layer 120 are substantially coterminous with the source electrode 114 and the drain electrode 116, respectively, and the first metal interconnect 122 and the second metal interconnect 124 are substantially coterminous with the first heat spreader layer 118 and the second heat spreader layer 120, respectively. During operation of the microelectronic device 100, heat may be generated in the component 104. The heat spreader layers 118 and 120 conduct the heat laterally away from the component 104 to the first bond structure 126 and the second bond structure 128, advantageously reducing a temperature rise in the component 104 compared to a microelectronic device with no heat spreader layers. In an alternate version of the instant example, the microelectronic device 100 may include one or more additional levels of metal interconnects between the source electrode 114 and the drain electrode 116, and the first heat spreader layer 118 and the second heat spreader layer 120. In a further version, the microelectronic device 100 may include one or more additional levels of metal interconnects between the first heat spreader layer 118 and the second heat spreader layer 120, and the first bond structure 126 and the second bond structure 128.

Figure 2:
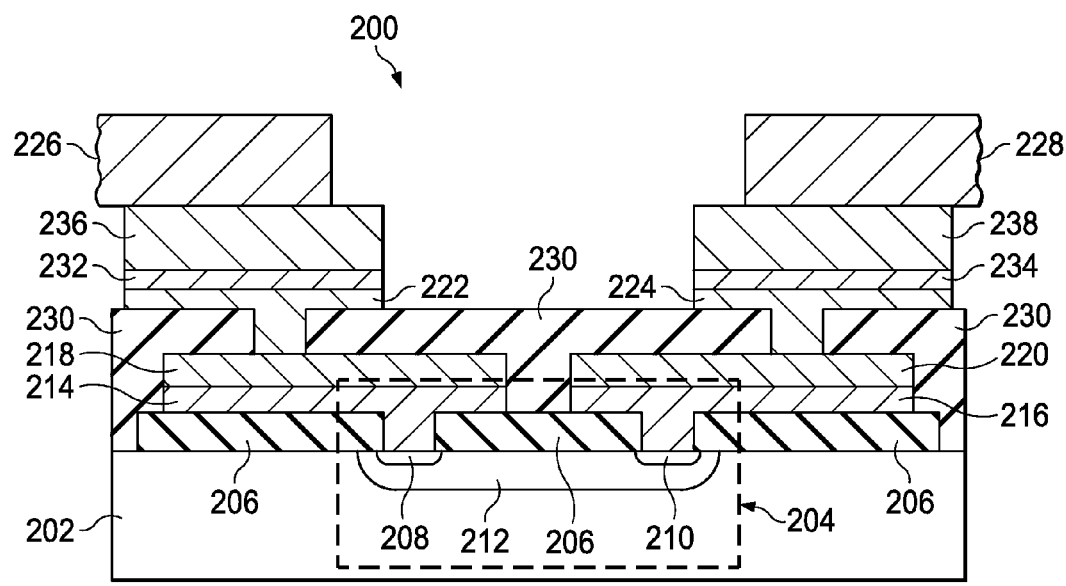
FIG. 2 is a cross section of another example microelectronic device including a heat spreader layer.

FIG. 2 is a cross section of another example microelectronic device including a heat spreader layer. The microelectronic device 200 is formed on a substrate 202 such as a semiconductor substrate 202. The microelectronic device 200 contains a component 204, depicted as a resistor 204 with a diffused layer 212 in the substrate 202. The microelectronic device 200 includes a first dielectric layer 206 above the substrate 202 with openings at a first head 208 and a second head 210 of the resistor 204. The microelectronic device 200 includes a first electrode 214 contacting the first head 208, and a second electrode 216 contacting the second head 210. The first electrode 214 and the second electrode 216 may include similar layers and compositions to the source electrode 114 and the drain electrode 116 of FIG. 1. The microelectronic device 200 includes a first heat spreader layer 218 formed on the first electrode 214 and a second heat spreader layer 220 formed on the second electrode 216. The first heat spreader layer 218 and the second heat spreader layer 220 may be formed concurrently, and are separate to provide electrical isolation between the first electrode 214 and the second electrode 216. The microelectronic device 200 includes a second dielectric layer 230 with openings on the first heat spreader layer 218 and the second heat spreader layer 220. A first metal interconnect 222 is formed over the second dielectric layer 230, making contact to the first heat spreader layer 218; a second metal interconnect 224 is formed over the second dielectric layer 230, making contact to the second heat spreader layer 220. The first metal interconnect 222 and the second metal interconnect 224 may be formed concurrently, and may have similar layers and compositions to the first metal interconnect 122 and the second metal interconnect 124 of FIG. 1. A third heat spreader layer 232 is formed on the first metal interconnect 222 and a fourth heat spreader layer 234 is formed on the second metal interconnect 224. A third metal interconnect 236 is formed on the third heat spreader layer 232 and a fourth metal interconnect 238 is formed on the fourth heat spreader layer 234. The third metal interconnect 236 and the fourth metal interconnect 238 may have similar layers and compositions to the first metal interconnect 222 and the second metal interconnect 224. Alternatively, the third metal interconnect 236 and the fourth metal interconnect 238 may include electroplated copper at least 5 microns thick. The microelectronic device 200 includes a first bond structure 226 which is electrically coupled to the third metal interconnect 236 and includes a second bond structure 228 which is electrically coupled to the fourth metal interconnect 238. In the instant example, the first bond structure 226 and the second bond structure 228 are beam leads 226 and 228.

The first heat spreader layer 218, the second heat spreader layer 220, the third heat spreader layer 232 and the fourth heat spreader layer 234 have the same properties as described in reference to the first heat spreader layer 118 and the second heat spreader layer 120 of FIG. 1. During operation of the microelectronic device 200, heat may be generated in the component 204. The heat spreader layers 218, 220, 232 and 234 conduct the heat laterally away from the component 204 to the first bond structure 226 and the second bond structure 228, advantageously reducing a temperature rise in the component 204 compared to a microelectronic device with no heat spreader layers. Forming the heat spreader layers 218, 220, 232 and 234 on the first level of metal interconnects, that is, the first metal interconnect 222 and the second metal interconnect 224, and on the second level of metal interconnects, that is, the third metal interconnect 236 and the fourth metal interconnect 238, may advantageously further reduce the temperature rise in the component 204 compared to a microelectronic device with a heat spreader layer on only one level of metal interconnects.

Figure 3:
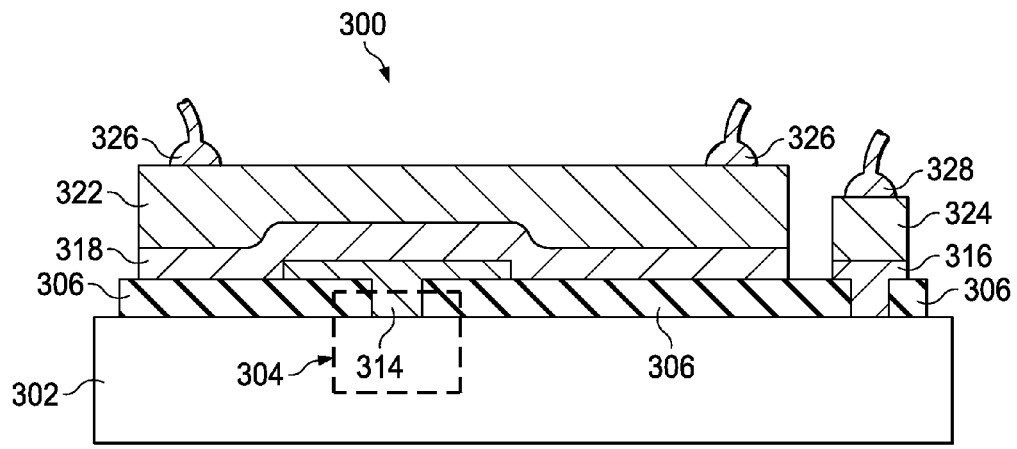
FIG. 3 is a cross section of a further example microelectronic device including a heat spreader layer.

FIG. 3 is a cross section of a further example microelectronic device including a heat spreader layer. The microelectronic device 300 is formed on a substrate 302. The microelectronic device 300 contains a component 304 formed in and/or on the substrate 302. The microelectronic device 300 may include a dielectric layer 306 above the substrate 302 with an opening on the component 304 and possibly another opening for another component or another connection. A first electrode 314 is formed on the component 304, possibly extending partway over the dielectric layer 306. A second electrode 316 may be formed, possibly concurrently with the first electrode 314, to make a connection to another component or another connection to the component 304 such as a connection to a gate of the component 304. A heat spreader layer 318 is formed on the first electrode 314. In the instant example, the heat spreader layer 318 extends past the first electrode 314 onto the dielectric layer 306, but not contacting the second electrode 316. In the instant example, the second electrode 316 is free of a heat spreader layer. A first metal interconnect 322 is formed on the heat spreader layer 318 and a second metal interconnect 324 is formed on the second electrode 316. The first metal interconnect 322 and the second metal interconnect 324 may be formed concurrently. A plurality of first bonding structures 326 is formed on the first metal interconnect 322 to provide a bond structure electrically coupled to the first metal interconnect 322; a second bond structure 328 is formed on the second metal interconnect 324. In the instant example, the bond structures 326 and 328 are wire bonds. In the instant example, the heat spreader layer extends under the first bond structures 326.

The heat spreader layer 318 has the same properties as described in reference to the first heat spreader layer 118 and the second heat spreader layer 120 of FIG. 1. During operation of the microelectronic device 300, heat may be generated in the component 304. Forming the heat spreader layer 318 to extend past the first electrode 314 and extend under the first bond structures 326 conducts the heat laterally away from the component 304 to the plurality of first bond structures 326, advantageously reducing a temperature rise in the component 304 compared to a microelectronic device with no heat spreader layers.

Figure 4:
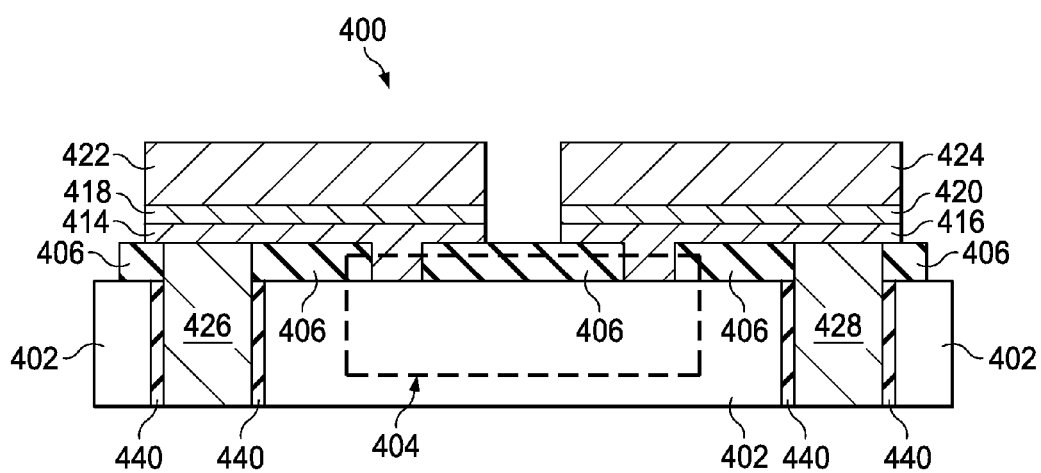
FIG. 4 is a cross section of another example microelectronic device including a heat spreader layer.

FIG. 4 is a cross section of another example microelectronic device including a heat spreader layer. The microelectronic device 400 is formed on a substrate 402. The microelectronic device 400 contains a component 404 formed in and/or on the substrate 402. The microelectronic device 400 may include a dielectric layer 406 above the substrate 402 with openings on the component 404 and openings for bond structures 426 and 428, which in the instant example are through-substrate vias 426 and 428, electrically isolated from the substrate 402 by dielectric liners 440. A first electrode 414 is formed on the component 404 and extends over the dielectric layer 406 to contact a top of the first through-substrate via 426. A second electrode 416 is formed on the component 404 and extends over the dielectric layer 406 to contact a top of the second through-substrate via 428. A first heat spreader layer 418 is formed on the first electrode 414 extending partway over the component 404 and over the first through-substrate via 426. A second heat spreader layer 420 is formed on the second electrode 416 extending partway over the component 404 and over the second through-substrate via 428. A first metal interconnect 422 is formed on the first heat spreader layer 418, extending partway over the component 404 and over the first through-substrate via 426. A second metal interconnect 424 is formed on the second heat spreader layer 420, extending partway over the component 404 and over the second through-substrate via 428. The first metal interconnect 422 advantageously provides a low impedance electrical path between the component 404 and the first through-substrate via 426, and the second metal interconnect 424 advantageously provides a low impedance electrical path between the component 404 and the second through-substrate via 428.

The first heat spreader layer 418 and the second heat spreader layer 420 have the same properties as described in reference to the first heat spreader layer 118 and the second heat spreader layer 120 of FIG. 1. During operation of the microelectronic device 400, heat may be generated in the component 404. Forming the heat spreader layers 418 and 420 to extend from the component 404 to the through-substrate vias 426 and 428 conducts the heat laterally away from the component 404 to the through-substrate vias 426 and 428, advantageously reducing a temperature rise in the component 404 compared to a microelectronic device with no heat spreader layers.

Figure 5:
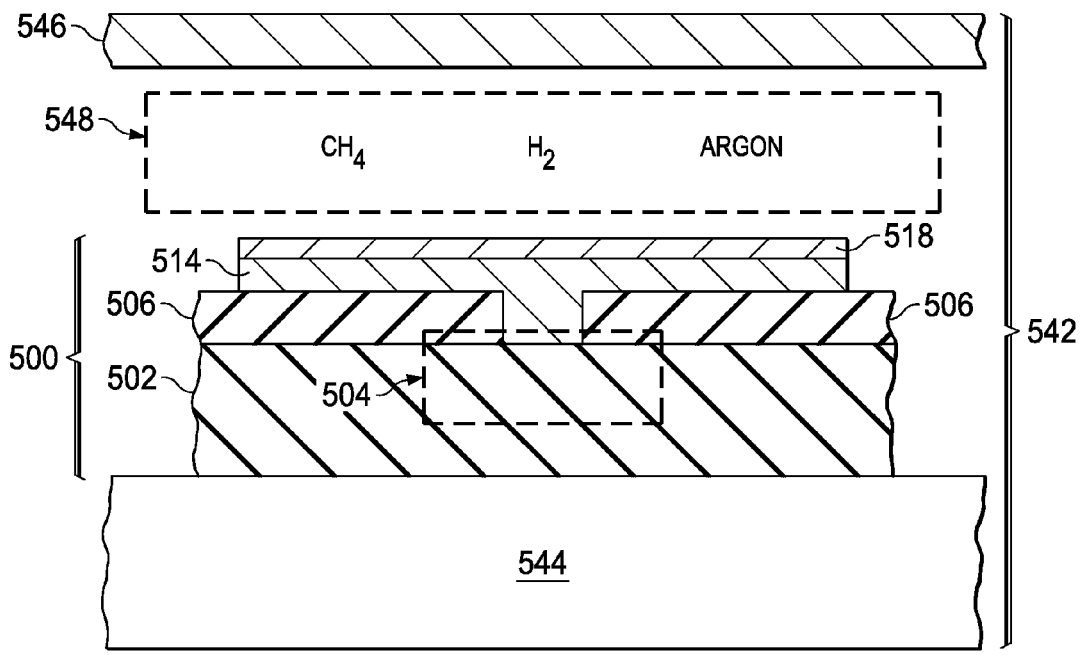
FIG. 5 depicts an example method for forming a heat spreader layer on a microelectronic device.

FIG. 5 depicts an example method for forming a heat spreader layer on a microelectronic device. The microelectronic device 500 is formed on a substrate 502 which may be, for example, a semiconductor wafer. A component 504 is formed in and/or on the substrate 502. A dielectric layer 506 is formed over the substrate 502 with an opening on the component 504. An electrode 514 is formed on the component 504 in the opening in the dielectric layer 506, and extends partway over the dielectric layer 506 around the opening. The electrode 514 is patterned so that the electrode extends over a desired area and does not extend over the entire substrate 502. It will be recognized that multiple instances of the microelectronic device 500 may be concurrently formed on the substrate 502.

The microelectronic device 500 is placed in a plasma enhanced chemical vapor deposition (PECVD) chamber 542 on a heated substrate holder 544. The PECVD chamber 542 has a plasma electrode plate 546 located above the substrate holder 544 so that the microelectronic device 500 is placed below the plasma electrode plate 546. The microelectronic device 500 is heated to 400° C. to 500° C. by the substrate holder 544, and carbon reactant gases such as methane ($CH_4$) are introduced to a plasma region 548 along with reducing reactants such as hydrogen and plasma assist gas such as argon. Radio frequency (RF) power at 13.56 MHz is applied to the plasma electrode plate 546, causing the reactant gases in the plasma region to form a plasma in the plasma region 548, producing carbon radicals which form a layer of graphite 518 on the electrode 514 of the microelectronic device 500. The RF power, temperature of the substrate holder 544, and pressure and flow rates of the reactant gases may be selected so that the graphite 518 grows selectively on the electrode 514 but not on the adjacent dielectric layer 506. The graphite layer 518 provides the heat spreader layer 518 of the microelectronic device 500. Forming the graphite layer 518 selectively on the electrode 514 and not on the adjacent dielectric layer 506 may eliminate patterning the graphite layer 518 and hence advantageously reduce fabrication cost and complexity of the microelectronic device 500.

In another version of the instant example known as a microwave assisted surface wave plasma chemical vapor deposition (MW-SWP-CVD) process, the microelectronic device 500 may be heated to 220° C. to 260° C., and RF power at a microwave frequency may be applied to the plasma electrode plate 546, forming a microwave plasma in the plasma region 548, and then forming the graphite layer 518. Using the MW-SWP-CVD process to form the graphite layer 518 may advantageously reduce thermal stress on the component 504 and other components of the microelectronic device 500.

Figure 6A:
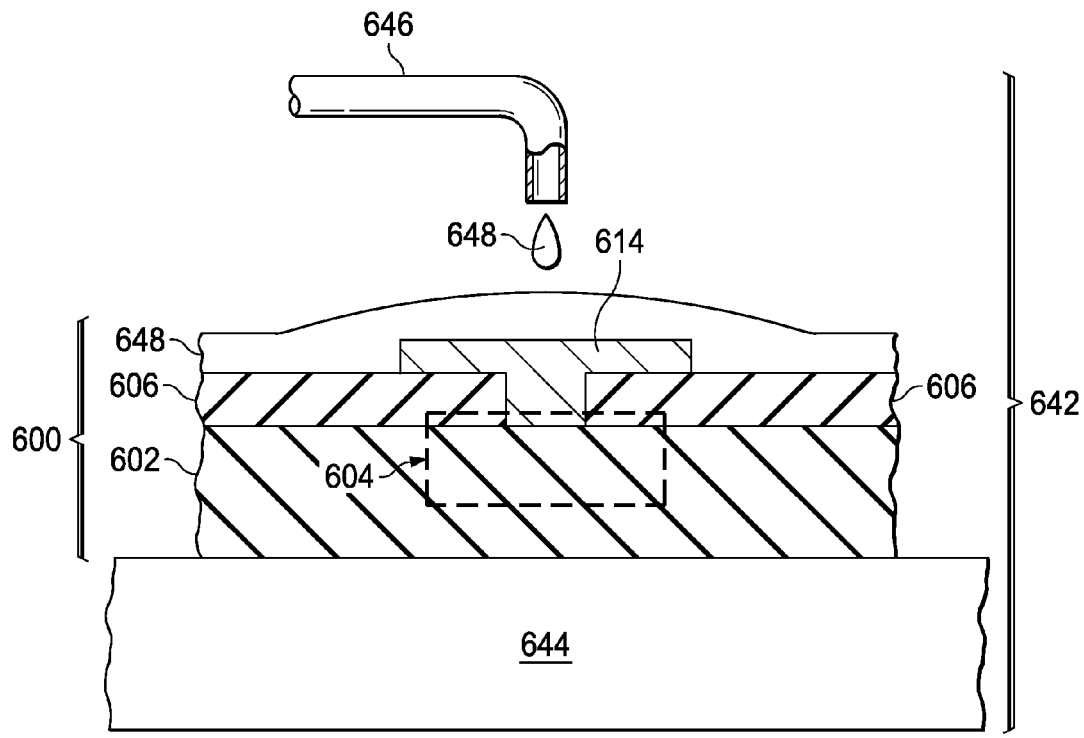
FIG. 6A and FIG. 6B depict another example method for forming a heat spreader layer on a microelectronic device.
Figure 6B:
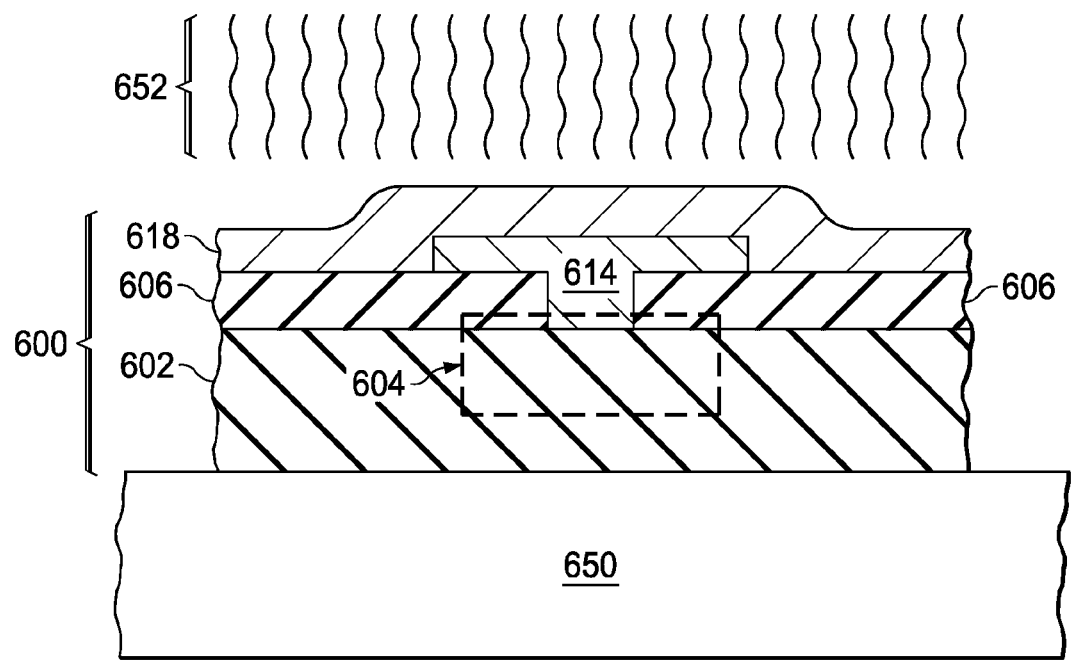

FIG. 6A and FIG. 6B depict another example method for forming a heat spreader layer on a microelectronic device. Referring to FIG. 6A, the microelectronic device 600 is formed on a substrate 602 which may be, for example, a semiconductor wafer. A component 604 is formed in and/or on the substrate 602. A dielectric layer 606 is formed over the substrate 602 with an opening on the component 604. An electrode 614 is formed on the component 604 in the opening in the dielectric layer 606, and extends partway over the dielectric layer 606 around the opening. The electrode 614 is patterned so that the electrode extends over a desired area and does not extend over the entire substrate 602. It will be recognized that multiple instances of the microelectronic device 600 may be concurrently formed on the substrate 602.

The microelectronic device 600 is placed in a spin-coating apparatus 642 on a substrate chuck 644. A dispense apparatus 646 provides a CNT dispersion 648 onto the electrode 614 and exposed areas of the dielectric layer 606. The CNT dispersion 648 includes CNTs dispersed in a solvent. The substrate chuck rotates to spread the CNT dispersion 648 so as to coat the microelectronic device 600.

Referring to FIG. 6B, the microelectronic device 600 is placed on a bake chuck 650 which heats the substrate 602 to 100° C. to 150° C. so as to evaporate solvent 652 from the CNT dispersion 648 of FIG. 6A to provide the heat spreader layer 618. The heat spreader layer 618 thus includes CNTs overlapping each other in a continuous layer. Forming the heat spreader layer 618 to include the CNTs advantageously provides a high in-plane thermal conductivity. Forming the heat spreader layer 618 using the spin-coat process of FIG. 6A and FIG. 6B advantageously reduces a thermal profile of the microelectronic device 500 and advantageously utilizes lower cost equipment compared to vacuum deposition equipment.

Figure 7A:
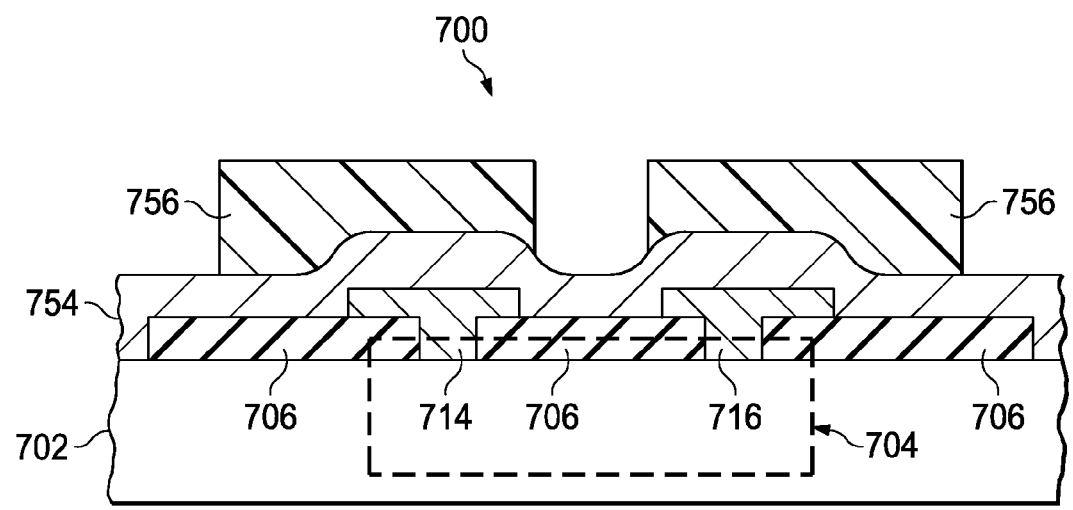
FIG. 7A and FIG. 7B depict an example method for patterning a heat spreader layer in a microelectronic device.
Figure 7B:
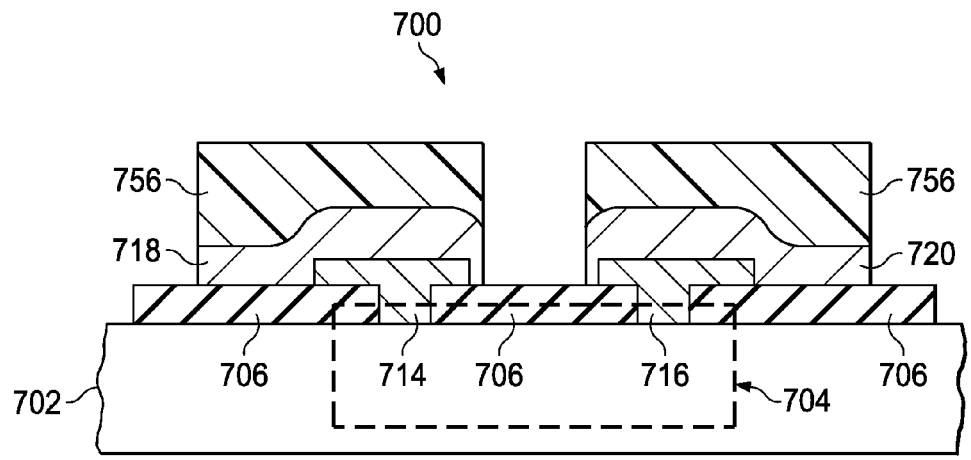

FIG. 7A and FIG. 7B depict an example method for patterning a heat spreader layer in a microelectronic device. Referring to FIG. 7A, the microelectronic device 700 is formed on a substrate 702. A component 704 is formed in and/or on the substrate 702. A dielectric layer 706 is formed over the substrate 702 with openings on the component 704. A first electrode 714 and a second electrode 716 are formed on the component 704 in the openings in the dielectric layer 706, and extend partway over the dielectric layer 706 around the openings. A continuous layer of heat spreader material 754 is formed over the first electrode 714, the second electrode 716 and the dielectric layer 706. The layer of heat spreader material 754 may include, for example, graphite, CNTs, and/or multiple layers of graphene. An etch mask 756 is formed over the layer of heat spreader material 754 above the first electrode 714 and a portion of the dielectric layer 706 around the first electrode 714, and above the second electrode 716 and a portion of the dielectric layer 706 around the second electrode 716. The etch mask 756 may include, for example, photoresist formed by a photolithographic process.

Referring to FIG. 7B, an etch process removes the layer of heat spreader material 754 of FIG. 7A in areas exposed by the etch mask 756 to leave a first heat spreader layer 718 on the first electrode 714 and a second heat spreader layer 720 on the second electrode 716. The etch mask 756 is subsequently removed, for example by a solvent spray process, so as not to remove a significant portion of the first heat spreader layer 718 and the second heat spreader layer 720. Fabrication of the microelectronic device 700 is continued by forming a first metal interconnect on the first heat spreader layer 718 and a second metal interconnect on the second heat spreader layer 720. Patterning the layer of heat spreader material 754 of FIG. 7A using the etch mask 756 may advantageously enable forming the heat spreader layers 718 and 720 with desired areas, including overlapping onto the adjacent dielectric layer 706.

Figure 8:
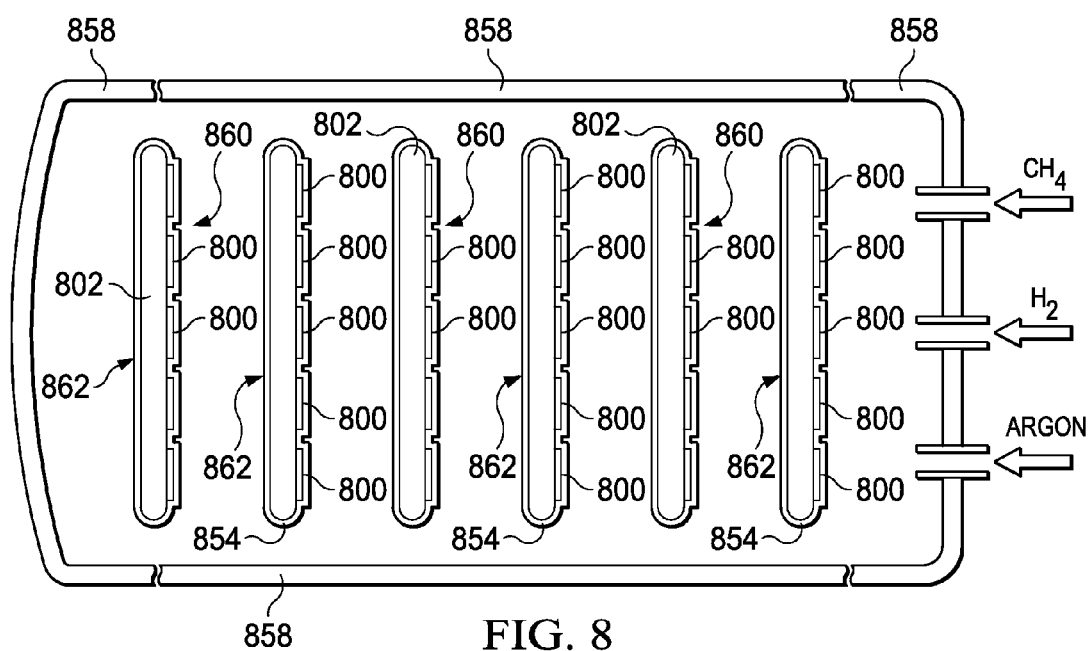
FIG. 8 depicts a further example method for forming a heat spreader layer on a microelectronic device.

FIG. 8 depicts a further example method for forming a heat spreader layer on a microelectronic device. A plurality of the microelectronic devices 800 is formed on one or more substrates 802. The substrates 802 may be, for example, semiconductor wafers. Each semiconductor device 800 includes a component and an electrode formed on the component, formed at a front surface 860 of the corresponding substrate 802. Each substrate 802 has a back surface 862 opposite from the front surface 860. The substrates 802 are placed in a deposition chamber 858 such as a furnace tube, so that the front surface 860 and the back surface 862 of each substrate 802 are exposed to an ambient of the deposition chamber 858. Reactant gases such as methane, hydrogen and argon are introduced into the deposition chamber 858 and the substrates 802 are heated. RF power may possibly be applied to form a plasma in the reactant gases. The reactant gases form a layer of heat spreader material 854 concurrently on the front surface 860 and the back surface 862 of each substrate 802. The substrates 802 are subsequently removed from the deposition chamber 858. The layer of heat spreader material 854 may be patterned on the front surface 860 of each substrate 802, for example as described in reference to FIG. 7A and FIG. 7B, to form heat spreader layers on the microelectronic devices 800. The layer of heat spreader material 854 may be patterned on the back surface 862 of each substrate 802 to form backside heat spreader layers which may advantageously reduce rises in temperature of the component, as described in the commonly assigned patent application having patent application Ser. No. 14/499,222, filed concurrently with this application, which is incorporated herein by reference. Forming the layer of heat spreader material 854 concurrently on the front surface 860 and the back surface 862 may advantageously reduce fabrication cost and complexity of the microelectronic devices 800.

Figure 9:
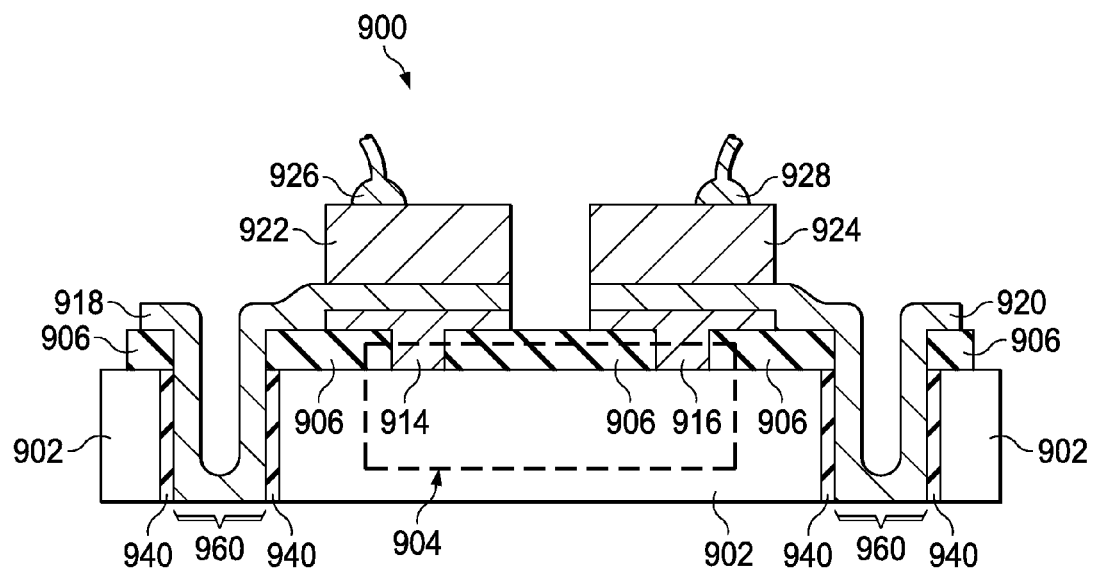
FIG. 9 is a cross section of a further example microelectronic device including a heat spreader layer.

FIG. 9 is a cross section of a further example microelectronic device including a heat spreader layer. The microelectronic device 900 is formed on a substrate 902. The substrate 902 has substrate holes 960 surrounded by dielectric liners 940; the substrate holes 960 may extend completely through the substrate 902 to a back surface of the substrate 902 as depicted in FIG. 9. The microelectronic device 900 contains a component 904 formed in and/or on the substrate 902. The microelectronic device 900 includes a dielectric layer 906 above the substrate 902 with openings on the component 904 and at the substrate holes 960. A first electrode 914 is formed on the component 904 and extends over the dielectric layer 906, and a second electrode 916 is formed on the component 904 and extends over the dielectric layer 906. A first heat spreader layer 918 is formed on the first electrode 914 extending into at least one of the substrate holes 960. A second heat spreader layer 920 is formed on the second electrode 916 extending into at least another of the substrate holes 960. A first metal interconnect 922 is formed on the first heat spreader layer 918, and a second metal interconnect 924 is formed on the second heat spreader layer 920. A first bond structure 926 is formed on the first metal interconnect 922, and a second bond structure 928 is formed on the second metal interconnect 924. In the instant example, the bond structures 926 and 928 are wire bonds. Forming the heat spreader layers 918 and 920 to extend into the substrate holes 960 may conduct heat from the component 904 to the back surface of the substrate 902 and advantageously reduce a temperature rise in the component 904. The configuration of FIG. 9 may be particularly advantageous for instances of the microelectronic device 900 mounted on leadframes or headers with die attach material on the back surface of the substrate 902.

Figure 10:
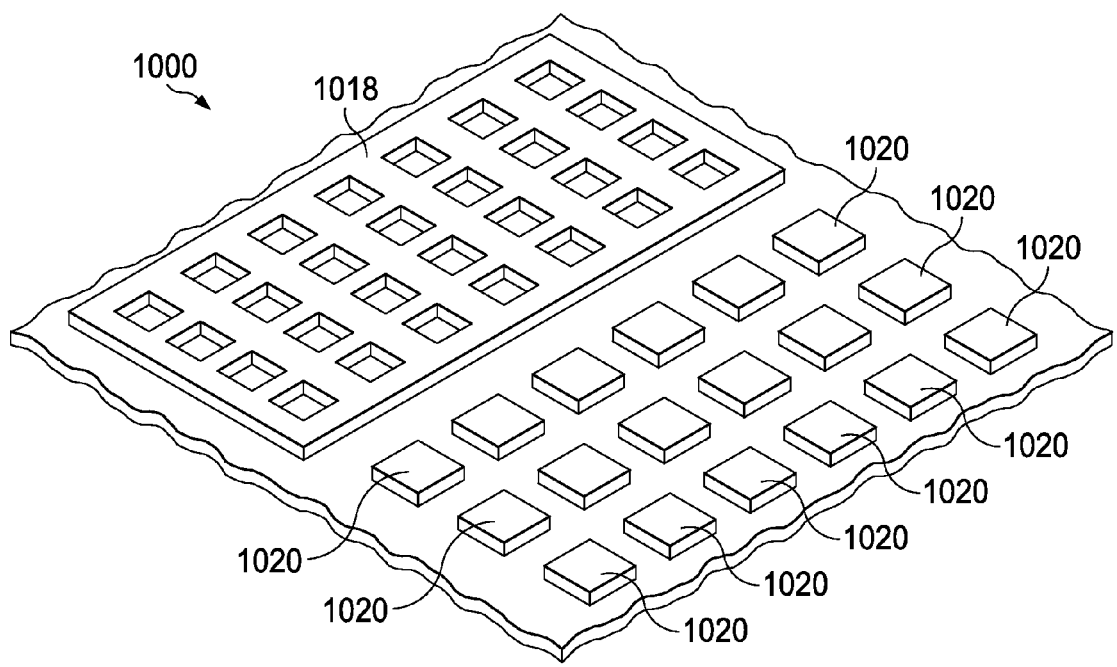
FIG. 10 depicts example configurations for patterned heat spreader layers.

FIG. 10 depicts example configurations for patterned heat spreader layers. A microelectronic device 1000 may include a first heat spreader layer 1018 which is contiguous and perforated, with an array of holes. The perforated configuration may advantageously increase adhesion of the first heat spreader layer 1018 to underlying layers of the microelectronic device 1000 compared to a heat spreader layer free of holes. The contiguous perforated configuration of the first heat spreader layer 1018 may advantageously have a higher lateral thermal conductance than a segmented heat spreader layer.

The microelectronic device 1000 may have a second heat spreader layer 1020 which is segmented, comprising a plurality of separate areas. The segmented configuration may advantageously increase adhesion of the second heat spreader layer 1020 to underlying layers. Segments of the second heat spreader layer 1020 may be formed on separate electrodes without short-circuiting the electrodes. The segmented configuration may advantageously enable increased lateral heat conduction over a plurality of underlying, electrically isolated, electrodes compared to a microelectronic device free of a heat spreader layer over electrically isolated electrodes. A microelectronic device may have a heat spreader layer which has a contiguous perforated configuration in one area and a segmented configuration in another area.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a microelectronic device, comprising the steps:
   providing a substrate;
   forming a component;
   forming an electrode on the component, disposed over the substrate;
   depositing a layer of heat spreader material comprising CNTs on the electrode to form a heat spreader layer including a layer of CNT dispersion comprising CNTs dispersed in a solvent followed by heating the substrate to remove at least a portion of the solvent to form a layer of CNTs overlapping each other in a continuous layer, so that the layer of CNTs extend past the electrode, wherein the layer of heat spreader material is 100 nanometers to 3 microns thick, has an in-plane thermal conductivity of at least 150 watts/meter-° K and an electrical resistivity of less than 100 micro-ohm-centimeters;
   forming a metal interconnect on the heat spreader layer; and
   forming a bond structure electrically coupled the metal interconnect.

2. The method of claim 1, wherein the layer of heat spreader material comprises graphite and the step of depositing the layer of heat spreader material comprises a plasma enhanced chemical vapor deposition (PECVD) process using methane and hydrogen to form a layer of graphite, and the layer of graphite is substantially coterminous with the electrode.

3. The method of claim 1, further comprising forming an etch mask over the layer of heat spreader material so as to cover an area for the heat spreader layer, and removing the layer of heat spreader material exposed by the etch mask.

4. The method of claim 3, wherein the etch mask has a segmented configuration such that the area for the heat spreader layer comprises a plurality of separate segments.

5. The method of claim 3, wherein the etch mask has a contiguous perforated configuration such that the area for the heat spreader layer comprises contiguous area with a plurality of openings.

6. The method of claim 1, wherein:
   the layer of heat spreader material is a first layer of heat spreader material;
   the heat spreader layer is a first heat spreader layer; and
   the metal interconnect is a first metal interconnect;
   and further comprising:
   forming a second layer of heat spreader material on the first metal interconnect, above the first heat spreader layer, to form a second heat spreader layer, wherein the second layer of heat spreader material is 100 nanometers to 3 microns thick, has an in-plane thermal conductivity of at least 150 watts/meter-° K and an electrical resistivity of less than 100 micro-ohm-centimeters; and
   forming a second metal interconnect on the second heat spreader layer, above the first metal interconnect, wherein the bond structure is electrically coupled to the first metal interconnect through the second metal interconnect and the second heat spreader layer.

7. The method of claim 1, wherein depositing the layer of heat spreader material forms the layer of heat spreader material concurrently on a front surface of the microelectronic device and on a back surface of the substrate.

8. The method of claim 1, further comprising forming at least one substrate hole in the substrate before depositing the layer of heat spreader material, so that the heat spreader layer extends into the at least one substrate hole.

* * * * *